United States Patent
Redeker et al.

(10) Patent No.: US 6,170,428 B1
(45) Date of Patent: *Jan. 9, 2001

(54) SYMMETRIC TUNABLE INDUCTIVELY COUPLED HDP-CVD REACTOR

(75) Inventors: Fred C. Redeker, Fremont; Farhad Moghadam, Los Gatos; Hiroji Hanawa, Sunnyvale; Tetsuya Ishikawa, Santa Clara; Dan Maydan, Los Altos; Shijian Li, San Jose; Brian Lue, Mountain View; Robert J. Steger, Cupertino; Manus Wong; Yaxin Wong, both of San Jose; Ashok K. Sinha, Palo Alto, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

This patent is subject to a terminal disclaimer.

(21) Appl. No.: 08/679,927

(22) Filed: Jul. 15, 1996

(51) Int. Cl.$^7$ .................................................. C23C 16/00

(52) U.S. Cl. ...................... 118/723 I; 156/345; 118/715

(58) Field of Search .......................... 118/723 I, 723 IR, 118/723 AN, 715; 156/345; 134/1.1; 315/111.51

(56) References Cited

U.S. PATENT DOCUMENTS

| | | | |
|---|---|---|---|
| 4,808,258 | * | 2/1989 | Otsubo et al. ........................ 156/643 |
| 4,878,994 | * | 11/1989 | Jucha et al. ........................... 156/643 |
| 5,242,561 | * | 9/1993 | Sato ................................. 204/192.33 |

(List continued on next page.)

FOREIGN PATENT DOCUMENTS

| | | |
|---|---|---|
| 0660449A1 | 6/1995 | (EP) . |
| 0668608A1 | 8/1995 | (EP) . |
| 0697467A1 | 2/1996 | (EP) . |

(List continued on next page.)

OTHER PUBLICATIONS

Lucovsky, G., et al., "Deposition of silicon dioxide and silicon nitride by remote plasma enhanced chemical vapor deposition," Journal of Vacuum Science & Technology, vol. 4, No. 3, May–Jun. (1986).
EP Search Report dated Nov. 11, 1997.
EP Search Report dated Apr. 14, 1998.

* cited by examiner

*Primary Examiner*—Thi Dang
*Assistant Examiner*—Luz Alejandro
(74) *Attorney, Agent, or Firm*—Thomason, Moser & Patterson

(57) ABSTRACT

The present invention provides an HDP-CVD tool using simultaneous deposition and sputtering of doped and undoped silicon dioxide capable of excellent gap fill and blanket film deposition on wafers having sub 0.5 micron feature sizes having aspect ratios higher than 1.2:1. The system of the present invention includes: a dual RF zone inductively coupled plasma source configuration capable of producing radially tunable ion currents across the wafer; a dual zone gas distribution system to provide uniform deposition properties across the wafer surface; temperature controlled surfaces to improve film adhesion and to control extraneous particle generation; a symmetrically shaped turbomolecular pumped chamber body to eliminate gas flow or plasma ground azimuthal asymmetries; a dual helium cooling zone electrostatic chuck to provide and maintain uniform wafer temperature during processing; an all ceramic/aluminum alloy chamber construction to eliminate chamber consumables; and a remote fluorine based plasma chamber cleaning system for high chamber cleaning rate without chuck cover plates.

26 Claims, 13 Drawing Sheets

U.S. PATENT DOCUMENTS

| | | | |
|---|---|---|---|
| 5,365,057 | | 11/1994 | Morley et al. .................... 250/214 |
| 5,401,350 | * | 3/1995 | Patrick et al. .................... 156/345 |
| 5,403,434 | * | 4/1995 | Moslehi ............................. 156/643 |
| 5,665,167 | * | 9/1997 | Deguchi et al. ................... 118/728 |
| 5,669,975 | * | 9/1997 | Ashtiani ........................... 118/723 I |
| 5,688,357 | * | 11/1997 | Hanawa ............................ 156/345 |
| 5,709,757 | * | 1/1998 | Hatano ............................ 134/22.14 |
| 5,753,044 | * | 5/1998 | Hanawa et al. .................. 118/723 I |
| 5,756,400 | * | 5/1998 | Yet et al. .......................... 438/710 |
| 5,767,628 | * | 6/1998 | Keller et al. ..................... 315/111.51 |
| 5,770,100 | * | 6/1998 | Fukuyama et al. ................. 216/69 |
| 5,792,261 | * | 8/1998 | Hama et al. ...................... 118/723 I |
| 5,792,272 | * | 8/1998 | Van Os et al. .................. 118/723 IR |
| 6,027,601 | * | 2/2000 | Hanawa ............................ 156/345 |

FOREIGN PATENT DOCUMENTS

| | | |
|---|---|---|
| 7-161695 | 6/1995 | (JP) . |
| WO 9703224A | 1/1997 | (WO) . |

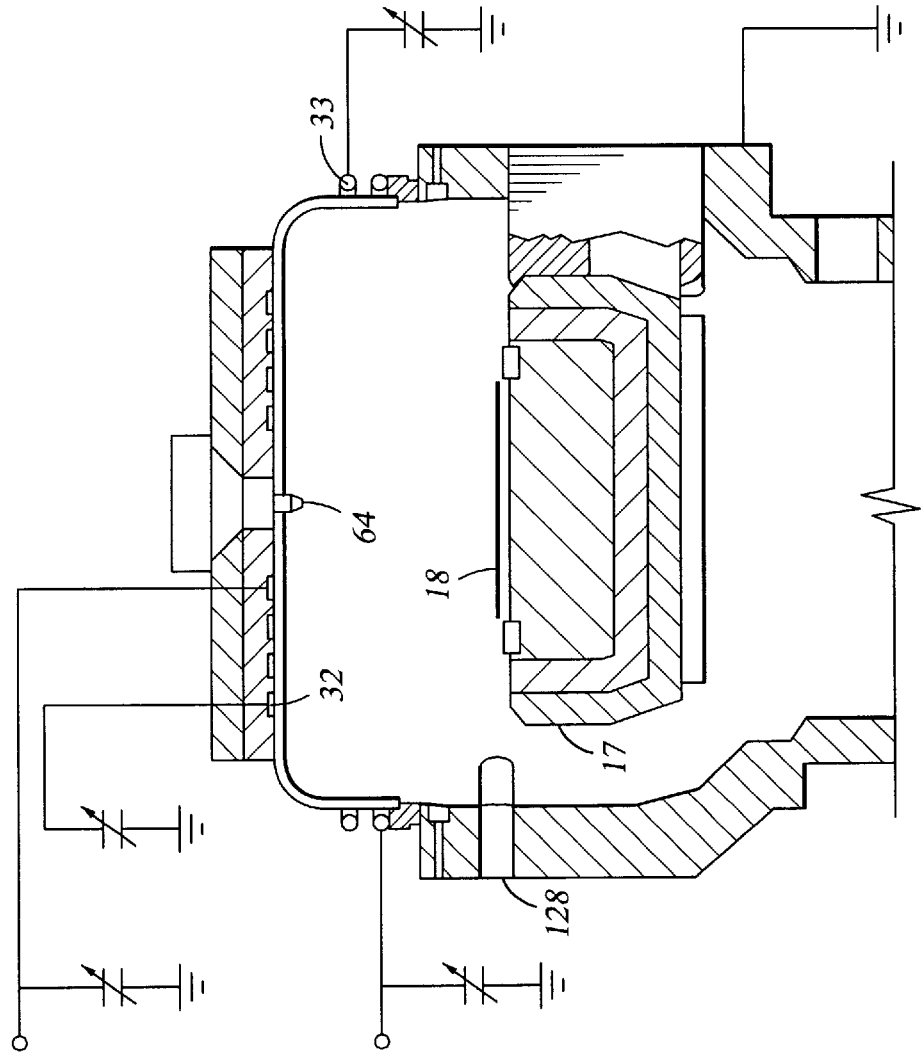
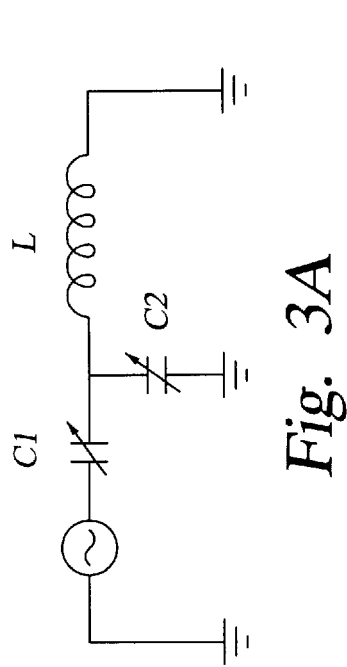
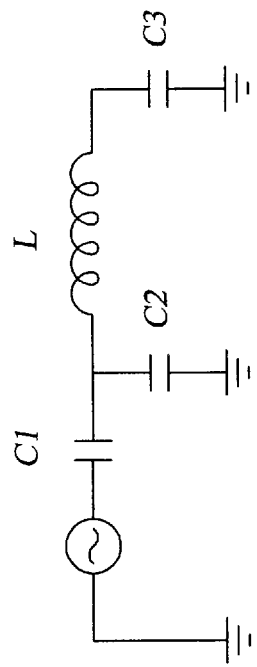
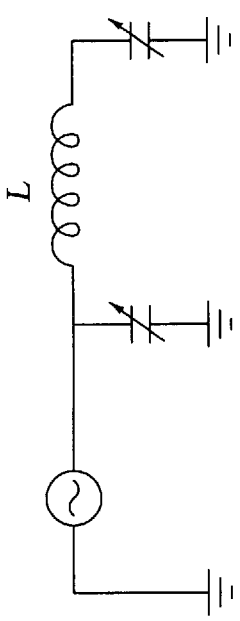
Fig. 4
Fig. 3A
Fig. 3B
Fig. 3C

SYMMETRIC TUNABLE INDUCTIVELY COUPLED HDP-CVD REACTOR

FIELD OF THE INVENTION

The present invention relates to an apparatus and method for processing semiconductor substrates, and more particularly, to a high density plasma (HDP) chemical vapor deposition (CVD) tool for deposition of films, preferably undoped and doped silicon dioxide, onto substrates.

BACKGROUND OF THE INVENTION

Chemical vapor deposition (CVD) is a gas reaction process used in the semiconductor industry to form thin layers or films of desired materials on a substrate. High density plasma (HDP) enhanced CVD processes use a reactive chemical gas along with physical ion generation through the use of an RF generated plasma to enhance the film deposition by attraction of the positively charged plasma ions onto a negatively biased substrate surface at angles near the vertical to the surface, or at preferred angles to the surface by directional biasing of the substrate surface. In integrated circuit (IC) fabrication, the goal is to form very thin, yet uniform films onto substrates, at a high throughput. Many factors, such as the type and geometry of the power source and geometry, the gas distribution system and related exhaust, substrate heating and cooling, chamber construction, design, and symmetry, composition and temperature control of chamber surfaces, and material build up in the chamber, must be taken into consideration when evaluating a process system as well as a process which is performed by the system.

The most widely used CVD films are tungsten, silicon dioxide, silicon nitride and polysilicon, although other CVD films suitable as insulators, dielectrics, conductors, semiconductors, superconductors and magnetics are known. The system of the present invention has been found to be particularly effective in forming thin films of doped and undoped silicon dioxide.

One problem encountered in IC fabrication is the difficulty associated with establishing a uniform plasma density over the entire substrate surface during processing. As substrate sizes increase, i.e., to 300 mm, single coil assemblies suffer wall losses and the like, thereby creating inefficient coupling of power into the plasma resulting in center peaked or cusped plasma profiles. The resulting deposition of material under non-uniform plasma densities results in films which are typically center thick or edge thick, and in either instance tend to be non-uniform.

Another problem encountered in IC fabrication is uniform gas distribution over the substrate surface. Typically, a gas plenum is provided around the perimeter of a processing region and a plurality of nozzles extend radially inwardly to provide gases over the edge of the substrate surface. The gases tend to be unevenly distributed across the substrate surface, with more gas provided towards the edge of the substrate and less gas provided towards the center of the substrate. In addition, reactant gases are typically mixed in the gas injection system prior to their introduction into the chamber. In these instances, material may deposit within the gas injection system itself thereby clogging some gas injectors further heightening the gas distribution problems.

The use of a symmetric vacuum deposition system for HDP-CVD is taught in co-assigned U.S. patent application Ser. No. 08/574,839, entitled "Symmetric Chamber," filed Dec. 12, 1995, which is incorporated herein by reference. A principal advantage of this type of system is the enhancement of uniform deposition due to symmetrical gas flow across the surface of the wafer or substrate. Ease of removal of a substrate support member and placement of a clean support member in its place without undue down time for the system is also desirable in maintaining the highest quality and turnaround time for a deposition system. The deposition system of the present invention provides this advantage also. As cleaning of the substrate support member can be particularly time consuming if done in place, a removable substrate support is very advantageous in keeping the substrate processing equipment running as continuously as possible.

Still another difficulty encountered in IC fabrication is maintaining a uniform temperature across the substrate surface. As a substrate is processed, the temperature of the substrate is typically elevated. If a temperature gradient exists across the substrate surface, the deposition of the film can proceed in a non-uniform manner. Therefore, it is important to precisely control the temperature of the substrate.

Another problem encountered in IC fabrication is the formation of extraneous particle sources in the deposition chamber itself. During processing, deposition material deposits throughout the chamber on the chamber walls, the substrate support member and on the gas distribution system components. Over time, such material build up can flake off into the chamber resulting in particle contamination on the substrate which can compromise the integrity of the devices being fabricated. Thus, the chamber must be periodically cleaned. A favored method of cleaning is to introduce cleaning gases into the chamber to react with the deposited material to form a product which can be exhausted from the chamber. Typically, a cleaning gas, such as a fluorinated gas, is introduced into the chamber and a plasma is struck in the chamber. The resultant excited products react with the deposition material to form a stable product which is then exhausted from the chamber. One problem with this process is that the cleaning is typically localized in regions adjacent to the plasma In order to enhance cleaning of all exposed chamber surfaces, the time period in which the cleaning process is performed is increased, thereby decreasing throughput, or the cleaning process is performed using high temperatures and/or pressures, thereby effectively over cleaning the chamber surfaces and increasing the cost of consumables.

Therefore, there remains a need for a process system which provides more uniform conditions for forming thin CVD films on a substrate. It would be desirable if the system incorporates a symmetric chamber having a removable substrate support, a frequency matched, tunable coil assembly to provide a uniform plasma over the substrate surface, a gas injection system to independently and uniformly introduce gases over the substrate surface, and a remote plasma source to provide a highly efficient chamber cleaning process within the chamber.

SUMMARY OF THE INVENTION

The present invention provides an HDP-CVD tool using simultaneous deposition and sputtering of doped and undoped silicon dioxide capable of excellent gap fill and blanket film deposition on wafers having sub 0.5 micron feature sizes having aspect ratios higher than 1.2:1. The system of the present invention includes: a dual RF zone inductively coupled plasma source configuration capable of producing radially tunable ion currents across the wafer; a dual zone gas distribution system to provide uniform deposition properties across the wafer surface; temperature controlled surfaces to improve film adhesion and to control extraneous particle generation; a symmetrically shaped turbomolecular pumped chamber body to eliminate gas flow or plasma ground azimuthal asymmetries; a dual helium cooling zone electrostatic chuck to provide and maintain uniform substrate temperatures during processing; an all ceramic/aluminum alloy chamber construction to eliminate chamber consumables; and a remote fluorine based plasma chamber cleaning system for high chamber cleaning rate without chuck cover plates.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are, therefore, not to be considered limiting of its scope, for the invention may admit to other equally effective embodiments.

FIGS. 3A–3C is an electrical schematic showing three various RF matching configurations that may be used in the system of the invention.

FIG. 4 is a schematic side view in partial cross section showing the dual zone RF plasma source of the system.

DESCRIPTION OF A PREFERRED EMBODIMENT

The HDP-CVD deposition system of the present invention physically comprises three major assemblies: 1) a plasma source including the gas distribution system; 2) a chamber body, including the electrostatic chuck and the pumping system; and 3) a remote microwave plasma cleaning system. These major assemblies will be discussed separately for the sake of organization, although it will be understood that in reality there is dynamic interaction between these assemblies.

Plasma Source

Figure 1:
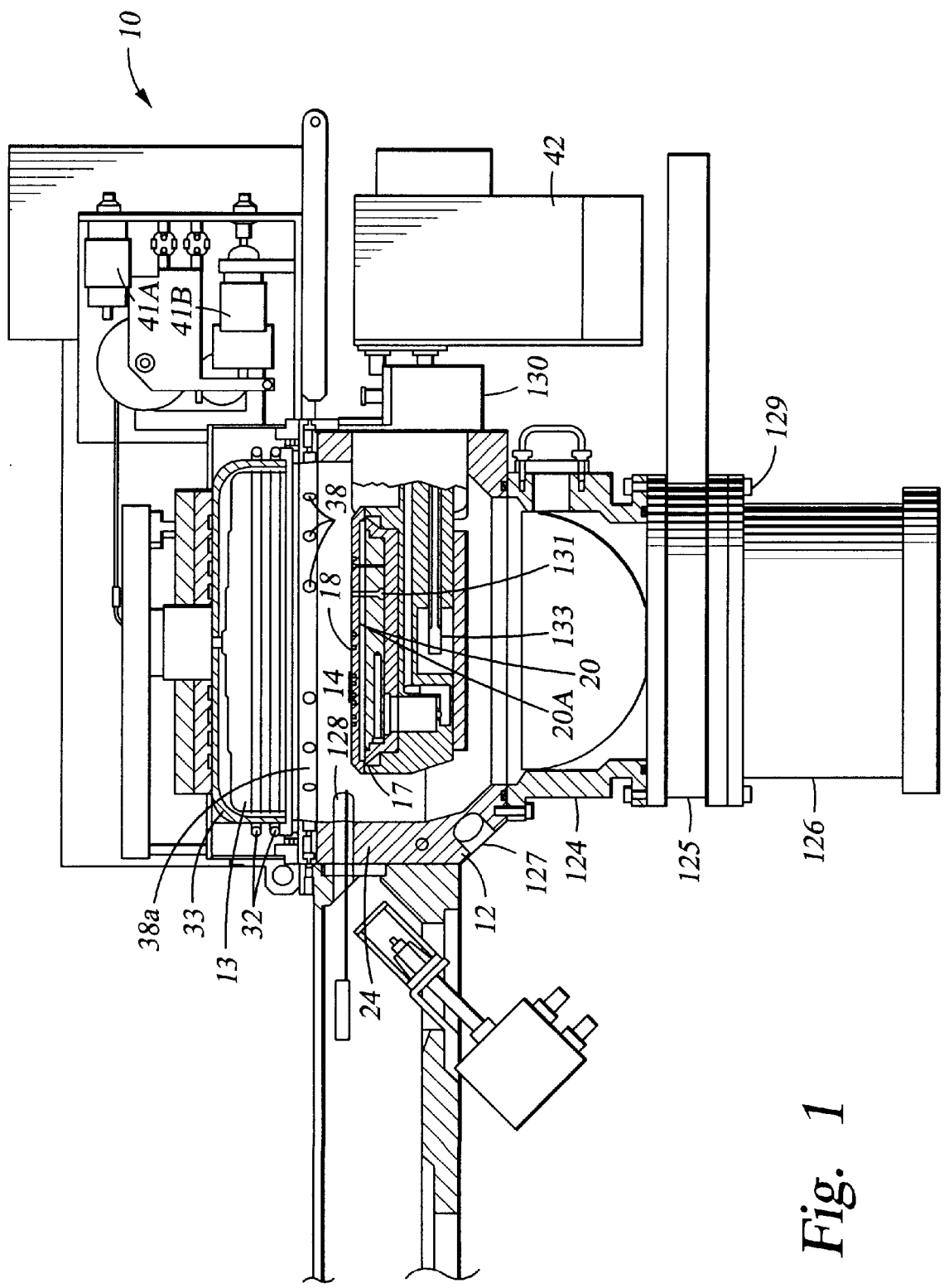
FIG. 1 is a schematic side view in partial cross section of a deposition chamber according to concepts of the present invention.
Figure 2:
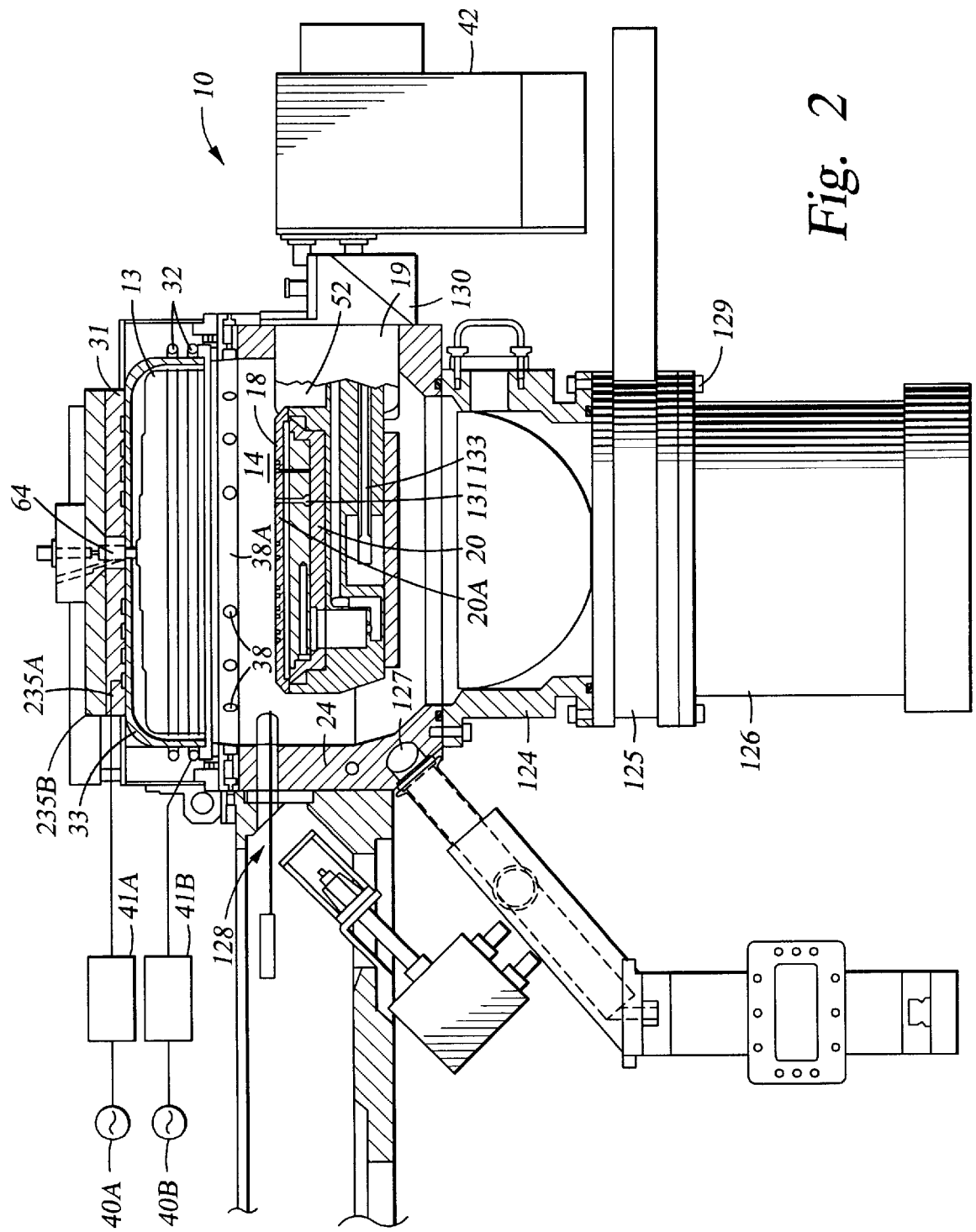
FIG. 2 is a schematic side view in cross section of the chamber of FIG. 1 showing more detail and a remote plasma cleaning cell attached.

Referring initially to FIGS. 1–6, various aspects of the plasma source portion of the process system of the present invention are shown. In FIGS. 1 and 2, a side view of the system 10 is shown schematically. The system 10 includes a chamber 13 having an outer wall 12, a cover 16 and a cantilevered, removable substrate support member 17. These members in combination form a physically symmetric gas exhaust passage and an electrically symmetric and an evacuable enclosure for processing a substrate 18. The outer wall 12 is typically made of aluminum and defines an inner processing chamber 13 that has a plasma processing region 14 adjacent the upper surface of substrate 18 and its support member 17. Substrate support member 17 is removable through a side port 19 and has a substrate receiving portion 20 which contains an electrostatic chuck 20$a$ which will be discussed in more detail below. The base portion 52 of the substrate support member 17 is mounted on the outside wall 24 of the chamber and includes an inner surface which forms a continuous inner wall with the chamber wall. Two separately powered RF coils, a top coil 31 and a side coil 32, are wound external to a dielectric dome 33. The dome 33 is preferably constructed of a ceramic, such as aluminum oxide ($Al_2O_3$) or aluminum nitride (AlN). The side coil 32 is covered by a symmetrical ground shield 235 to reduce electrical crosstalk between the coils 31 and 32. The RF coils 31 and 32 are powered by two variable frequency (1.8–2.1 MHZ) RF sources 40$a$ and 40$b$. The two RF power sources 40$a$ and 40$b$ are coupled to coils 31 and 32, respectively.

Each power source includes a control circuit which measures reflected power and which adjusts a digitally controlled synthesizer in the RF generator to sweep frequencies, typically starting at 1.8 MHZ, so as to minimize the reflected power. When the plasma ignites, the circuit conditions change because the plasma acts as a resistor in parallel with the coil. At this stage, the RF generator continues to sweep the frequency until the minimum reflected power point is again reached. The power source circuitry is designed so that each set of windings resonates at or near the frequency at which the minimum reflected power point is reached, so that the voltage of the windings is high enough to drive sufficient current to sustain the plasma. Thus, frequency tuning guarantees that the system remains close to resonance even if the resonance point of the circuit changes during the process. In this way, frequency tuning eliminates the need for circuit tuning and impedance matching by varying the values of impedance matching components (e.g., capacitors or inductors).

Each power source ensures that the desired power is delivered to the load despite any impedances mismatches, even continuously varying impedance mismatches which can arise due to changes in the plasma impedance. To ensure that the correct power is delivered to the load, each RF generator dissipates the reflected power itself and increases the output power so that the delivered power remains at the desired level.

Referring now to FIGS. 3(a),(b) and (c), three separate local RF match configurations are shown schematically. FIG. 3(a) shows a matching configuration for use with a coil L having one end grounded. The two capacitors C1 and C2 form an RF voltage divider. In FIG. 3(b), a balanced coil L having two shunt capacitors C2 and C3, where C2≈C3, across it to ground is used to match the load (plasma) frequency. Finally, in FIG. 3(c) a pi ($\pi$) network match is used having two variable capacitors to ground across the coil L. Since the output impedance of most conventional RF generators is designed to be 50 ohms, matching networks 3(a), (b) or (c) can be used to transfer maximum power to plasmas ranging in impedance from as low as 5 ohms to as high as 900 ohms (in the balanced load case). This dual coil system allows control of the radial ion density profiles in the reaction chamber 13.

Figure 5:
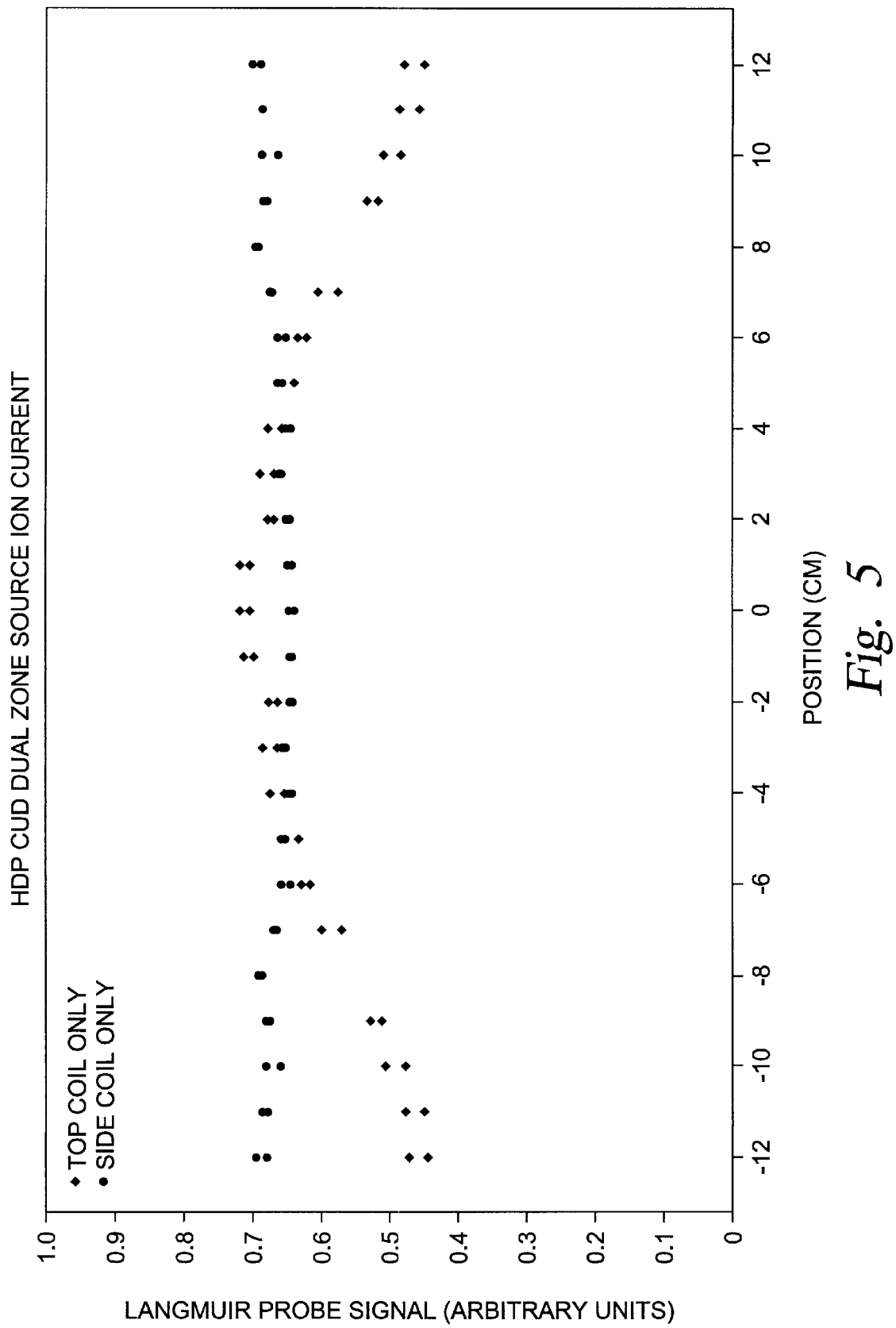
FIG. 5 is a graphical representation showing the ion current distribution produced by the coils of FIG. 4 as measured by a Langmuir probe.
Figure 6A:
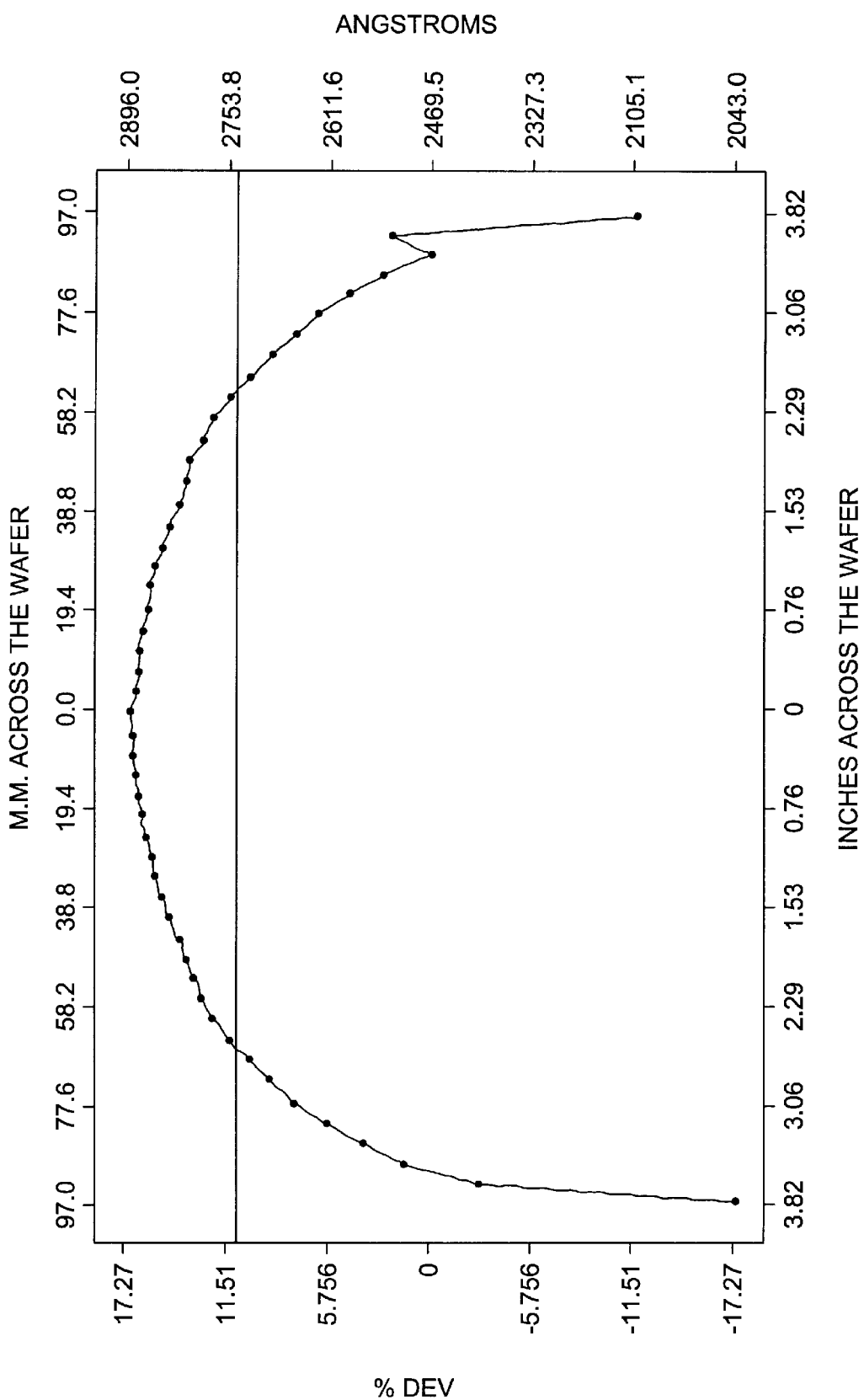
FIG. 6($a$) and 6($b$) is a graphical representation showing the deposition uniformity across the wafer plotted as a function of the use of the individual coils of FIG. 4.
Figure 6B:
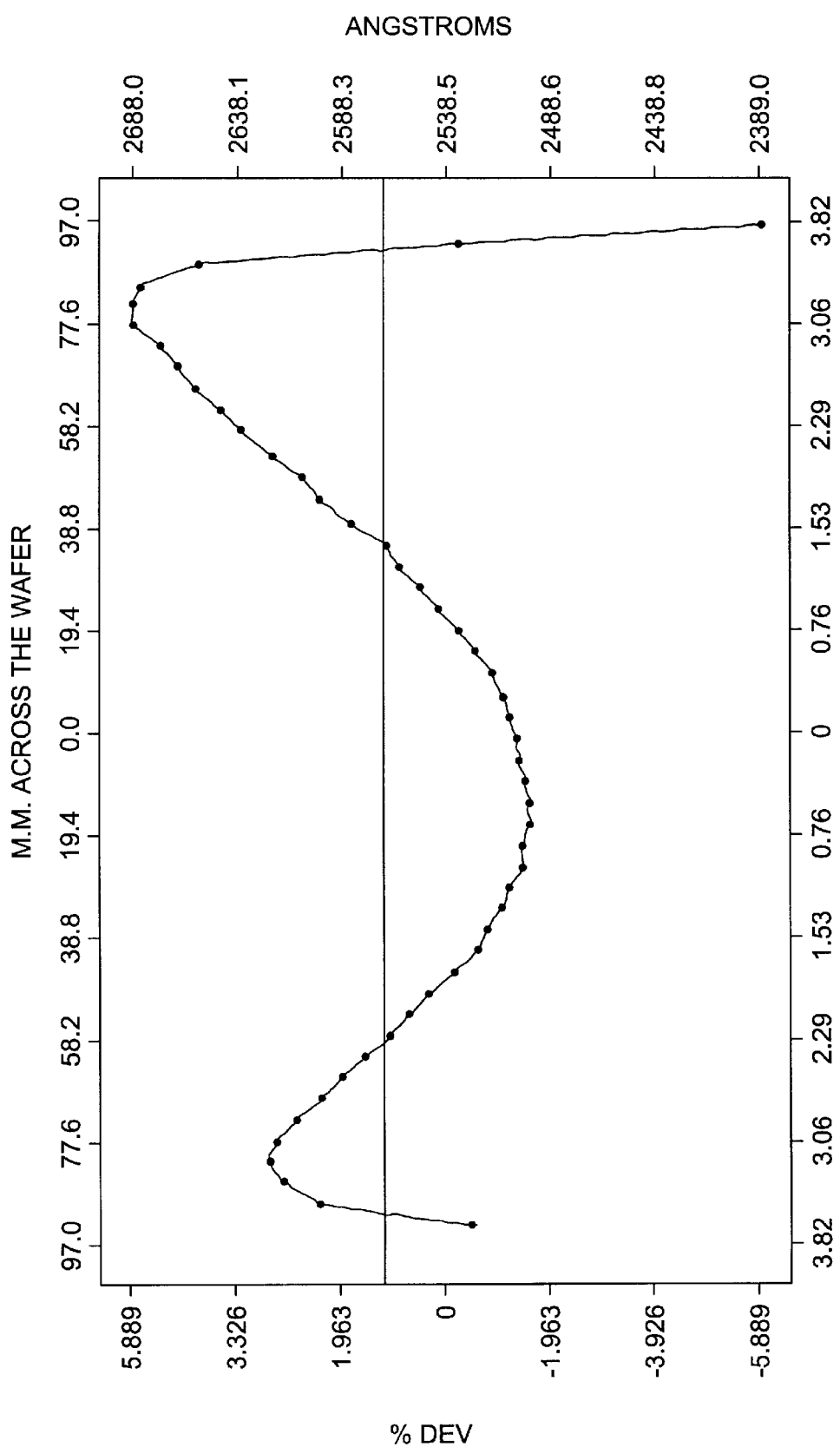

Referring to FIG. 4, a schematic side view of the chamber 13 is provided showing principally the coil geometry and RF feeds for top coil 31 and side coil 32. The pi network matching system described in FIG. 3(c) is shown in FIG. 4. As shown in FIG. 5, a Langmuir probe was introduced into the chamber 13 to measure the plasma ion current at different positions across the chamber 13 using the top coil only, and the side coil only, to excite the plasma in region 13. This figure clearly shows how the dual coil arrangement, when properly tuned to a substrate being processed, can generate uniform ion current across its surface. Uniform ion current across the substrate surface leads to the uniform deposition onto the wafer surface as shown in FIGS. 6(a) and 6(b). These figures show the deposition percent deviation (from mean) as a function of position across the substrate being processed for the top coil only 6(a) and for the side coil only 6(b). This representation shows how if the action of the coils is superimposed, uniform plasma density results and deposition may be vastly improved.

Returning now to FIGS. 1 and 2, the dielectric dome 33 is surmounted by a heater plate 235A and a cold plate 235B as shown. By direct conduction, heater plate 35a and cold plate 35b may be used to control the dome temperature. Control of the dome temperature to within ≈10° K improves deposition adhesion and has been found to reduce flake or particle counts in the chamber. The dome temperature is generally kept within the range of from about 100° C. to about 200° C. depending on processing requirements. It has been shown that higher chamber clean rates (etch rates) and better film adhesion to the substrate can also be obtained at higher dome temperatures.

Figure 7:
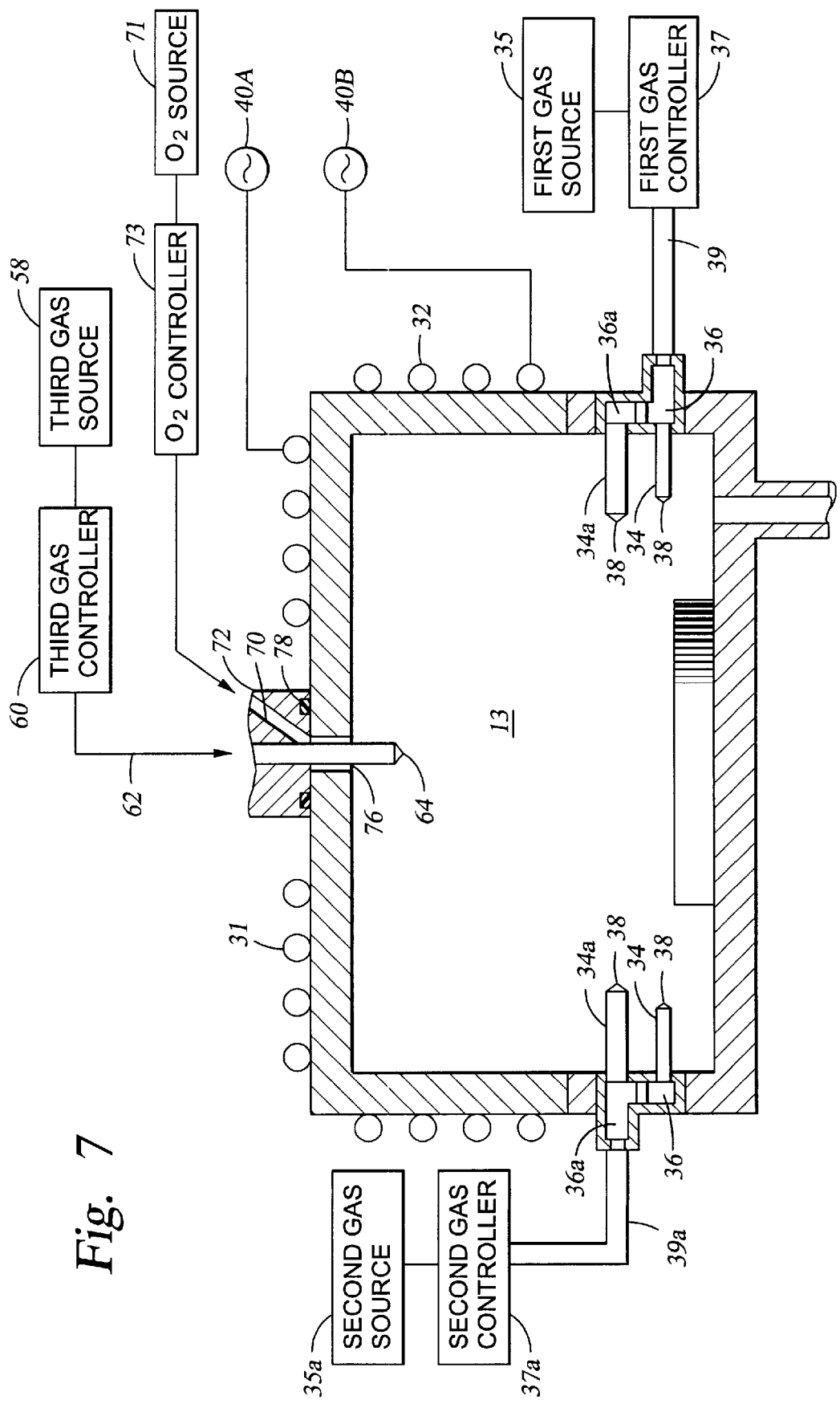
FIG. 7 is a schematic side view partially in section showing the gas control system of the invention.
Figure 8B:
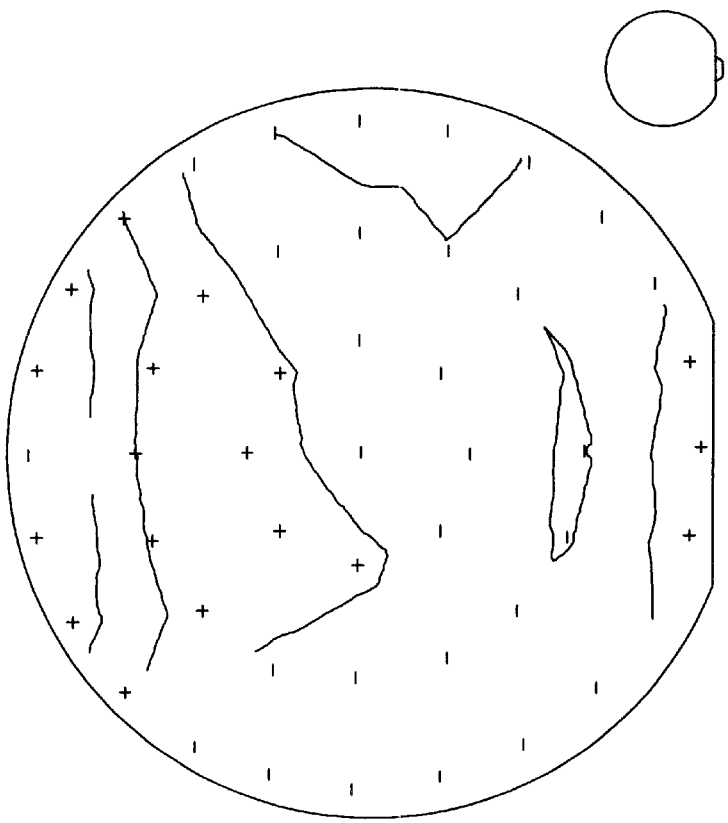
FIG. 8($a$) and 8($b$) are schematic diagrams showing the HDP-CVD deposition and sputter uniformity for optimized chamber conditions plotted as standard deviation contour plots.
Figure 8A:
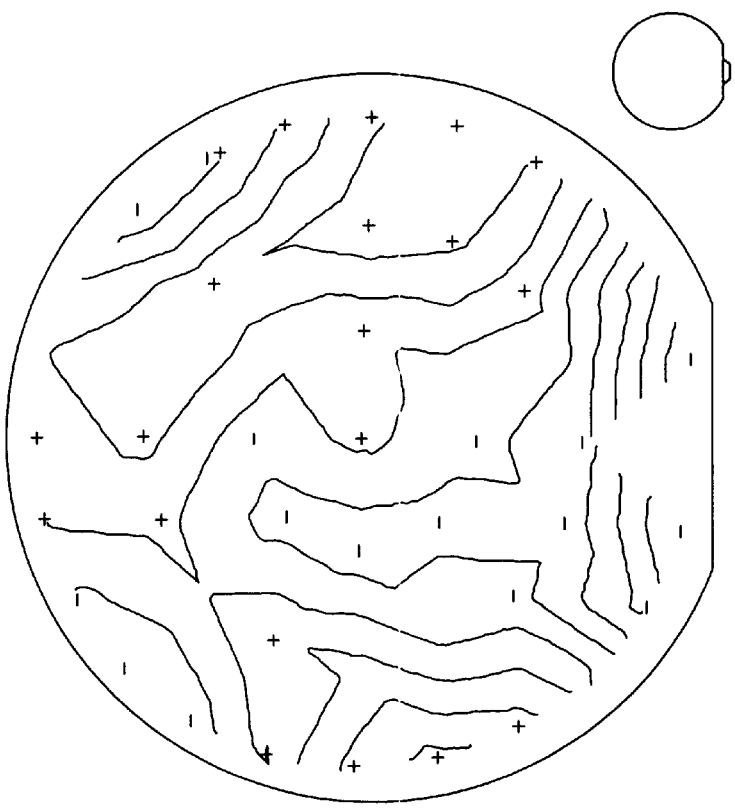

Referring now to FIGS. 1, 2 and 7, it will be seen that deposition gases are introduced into the chamber through both circumferentially mounted gas nozzles 38 located near the bottom of the chamber 13, and a centrally located gas nozzle 64 near the top of the chamber. As can be seen in FIG. 7, as many as three different gases can be introduced into the chamber via the nozzles 38 and 64. In addition, oxygen can be introduced along side nozzle 64 and mixed with the other gases introduced via nozzle 64 at the portion of chamber 13. A first gas source 35 and a first gas controller 37 control entry of the first gas into the chamber via line 39 through plenum 36 and circumferential nozzles 38 connected thereto. Similarly, a second gas source 35 and second gas controller 37a supply a second desired gas via line 39a through plenum 36a and circumferential gas nozzles 38. A third gas source 58 and third gas controller 60 supply a third gas via line 62 to a plenum 72 which also receives $O_2$ (if desired) from an $O_2$ source 71 and $O_2$ flow rate controller 73. The plenum 72 receives $O_2$ via orifice 70 and mixes it with the third gas in nozzle 64 which penetrates the chamber 13 via orifice 76 therein. O-ring 78 sealingly attaches the plenum 72 to the outside wall of the chamber 13. The third gas and $O_2$ are mixed in the upper portion of region 13 as both gases enter the chamber.

Both reactant and oxidizing gases are introduced into the chamber via circumferential nozzles 38 from separate plenums 34 and 34a as shown in FIG. 7. The gas ring 38a into which circumferential nozzles 38 are attached is removable. This facilitates easy change of the angle which the nozzles 38 present to the plane of the wafer being processed. One plenum exists in the ring 38a itself and feeds the reactant gas on both sides from a line in the chamber body for uniform initial layer properties. A second plenum is designed into the chamber body and feeds oxidizing gas nozzles 38 in the gas ring 38a through single individual feed holes to each of the oxidizer nozzles. The ability to change the nozzle angle as well as nozzle length by changing rings 38a allows the uniformity profile as well as the gas utilization efficiency to be varied. The top nozzle 64 enters chamber 13 through orifice 76 as described previously. Reactant gases are fed through nozzle 64 while oxidizers, such as $O_2$, can be fed as discussed previously. Independent control of top and side flows of reactant gases and oxidizing gases allows fine adjustment of the deposition film parameters and/or doping parameter uniformities of the film.

Chamber Body/Electrostatic Chuck Assembly

Referring again to FIGS. 1 and 2, the chamber body 24 which supports the previously described dielectric dome 33 comprises two main elements. The first of these elements is a body member 24 itself which provides structural support for the previously described plasma source and for the electrostatic chuck 20a, which will be described in more detail subsequently. Body member 24 attaches to a pumping stack comprising a twin blade throttle body 124, a gate valve 125 and a turbomolecular pump 126. The electrostatic chuck 20a is supported by cantilever from the side of body member 24 opposite a slit valve. The support structure 24 is designed to offer minimum obstruction to gas flow, thereby preserving as closely as possible the concept of symmetric pumping as described in co-pending, co-assigned, U.S. patent application Ser. No. 08/574,839, filed Dec. 12, 1995, which is incorporated herein by reference.

Figure 9:
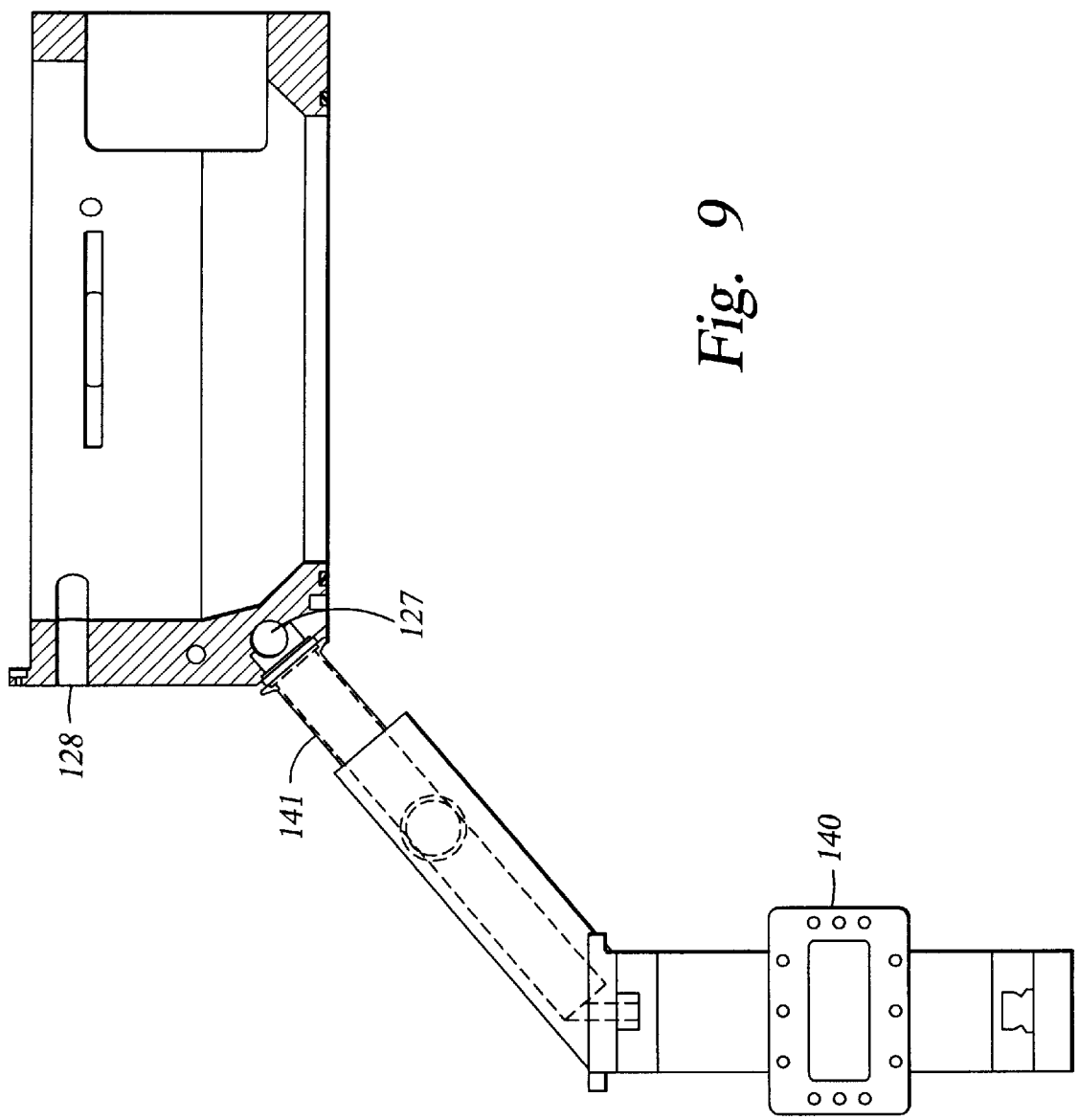
FIG. 9 is a schematic side view partially in section showing the microwave remote plasma clean inlet port and its location on the chamber body of the deposition chamber of FIGS. 1 and 2.

Two side ports 127 and 128 (FIGS. 1, 2, and 9) are introduced on opposite sides of the chamber wall 12 at about the level of electrostatic chuck 20a through which the disassociated fluorine containing gases used for cleaning may be introduced. This location of the openings 127 and 128 was chosen to maximize the etch rates of deposited material on the areas of the reactor which have the thickest deposition. The dissociated cleaning gases are piped internally through the chamber body from the flange inlet 127 below the slit valve 128 which allows for proper integration with any of a variety of remote plasma cells which can be attached to port 127.

The chamber body 24 tapers down to the diameter of the flange 129 of the turbomolecular vacuum pump 126. The twin blade throttle assembly 124 and gate valve 125 are mounted between the chamber body member 24 and the turbomolecular pump 126. This arrangement allows isolation (via gate valve 125) and/or pressure control at pressures of from about 0 to about 100 milliTorr (as determined by settings of twin blade throttle 124).

The electrostatic chuck assembly 20a maybe of the type described in co-assigned U.S. Pat. No. 5,350,479 or U.S. patent application Ser. No. 08/641,147, filed on Apr. 25, 1996, both of which are incorporated herein by reference. The chuck 20a includes helium substrate cooling, pneumatically operated, via pneumatic assembly 130, mechanically lifted support pins 131 and RF and DC chucking bias and RF matching network 42 as required to support wafer 18 for processing. Wafer lift pins 131 are pneumatically operated to raise or lower wafer 18 as desired by pneumatic lift controller unit 130. The chuck pedestal may comprise, for example, a dielectric coated metal body of unipolar design containing dual helium cooling zones isolated from each other. Independent temperature control of the dual zone helium substrate cooling allows promotion of very uniform temperature across a wafer 18 being processed.

Figure 10B:
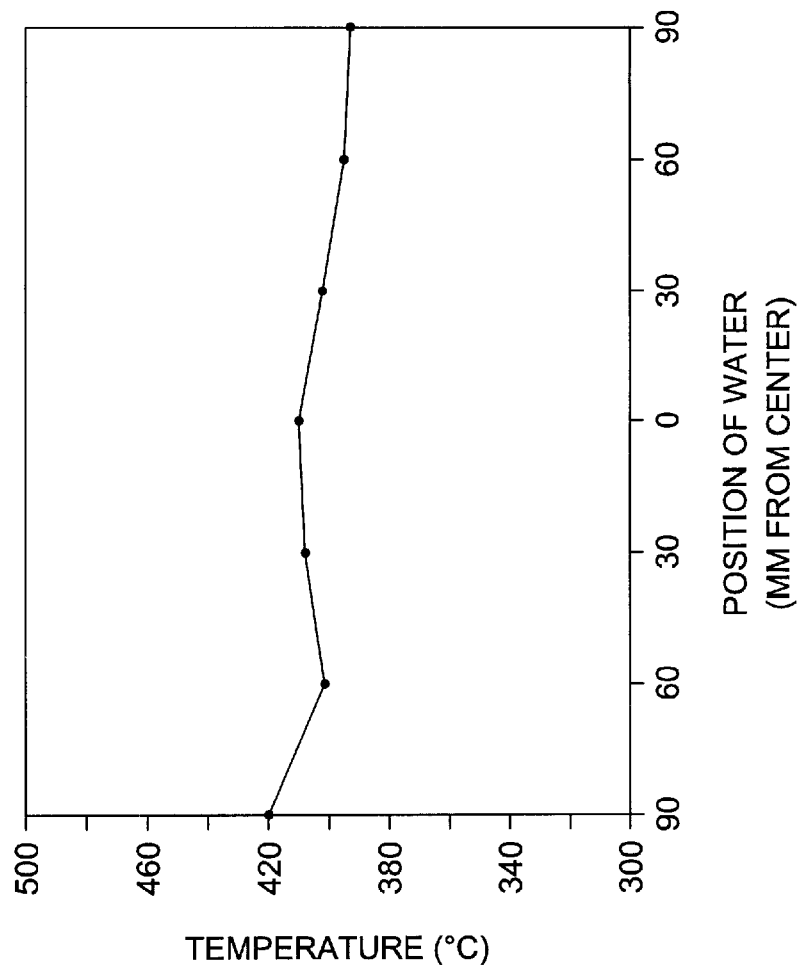
FIGS. 10($a$) and ($b$) are graphical representations showing (a) the wet etch uniformity of a wafer as a standard deviation contour and (b) the temperature as a function of position on the wafer during the deposition process using the system of the invention.
Figure 10A:
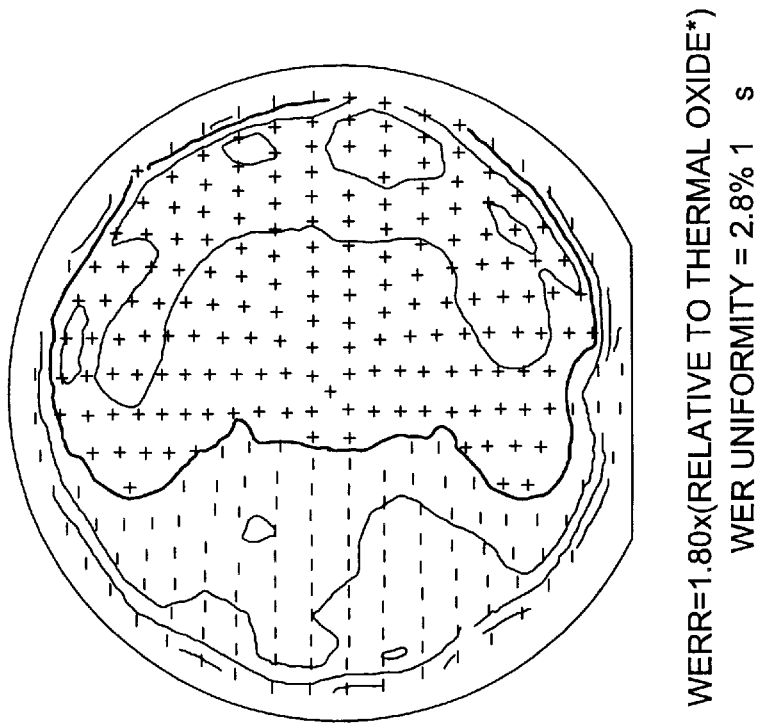

Referring now to FIGS. 10(a) and (b), the wafer etch uniformity is displayed graphically as a function of standard deviation contours in FIG. 10(a). FIG. 10(b) shows the corresponding temperature distribution across the wafer 18 as a function of wafer radial position. The body member of the electrostatic chuck 20a is preferably maintained at about 75° C. using a piped heat exchange liquid (not shown), though the temperature may be varied as desired.

Chuck assembly 20a contains an RF feedthrough 133 which permits the wafer or substrate 18 to be RF biased via RF bias match unit 42. RF bias match unit 42 operates at the industrial frequency of 13.56 MHZ so that it is compatible with commercially available RF power supplies. However, bias match unit 42 could be mounted remotely, if desired, and could use frequencies below 3 MHZ to change the ion energy distribution in chamber 13 if desired.

Remote Plasma Cleaning System

Referring now to FIGS. 9–13, the wafer deposition system of the present invention is provided with a remote plasma chamber cleaning system 140. One remote chamber cleaning system used to advantage in the present invention is described in U.S. patent application Ser. No. 08/278,605, filed on Jul. 21, 1994, which is incorporated herein by reference. In microwave generated plasmas or excited gases, a resonant microwave cavity operating typically at the industrially assigned frequency of 2.45 GHz has a glass gas feed tube passed through it. The microwave energy is coupled to the selected cleaning gas flowed though the glass tube in the resonant cavity and causes excitation of the neutral atoms therein to an excited state. The excited gas is routed into cleaning gas feed port 127 via a connecting tube 141 of suitable material to transfer the excited gas and which is kept to the minimal length necessary to achieve this delivery.

In the chamber 13, the etch cleaning reactions which proceed most rapidly are of the type;

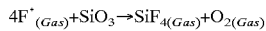
$$4F^*_{(Gas)} + SiO_3 \rightarrow SiF_{4(Gas)} + O_{2(Gas)}$$

and

Figure 11:
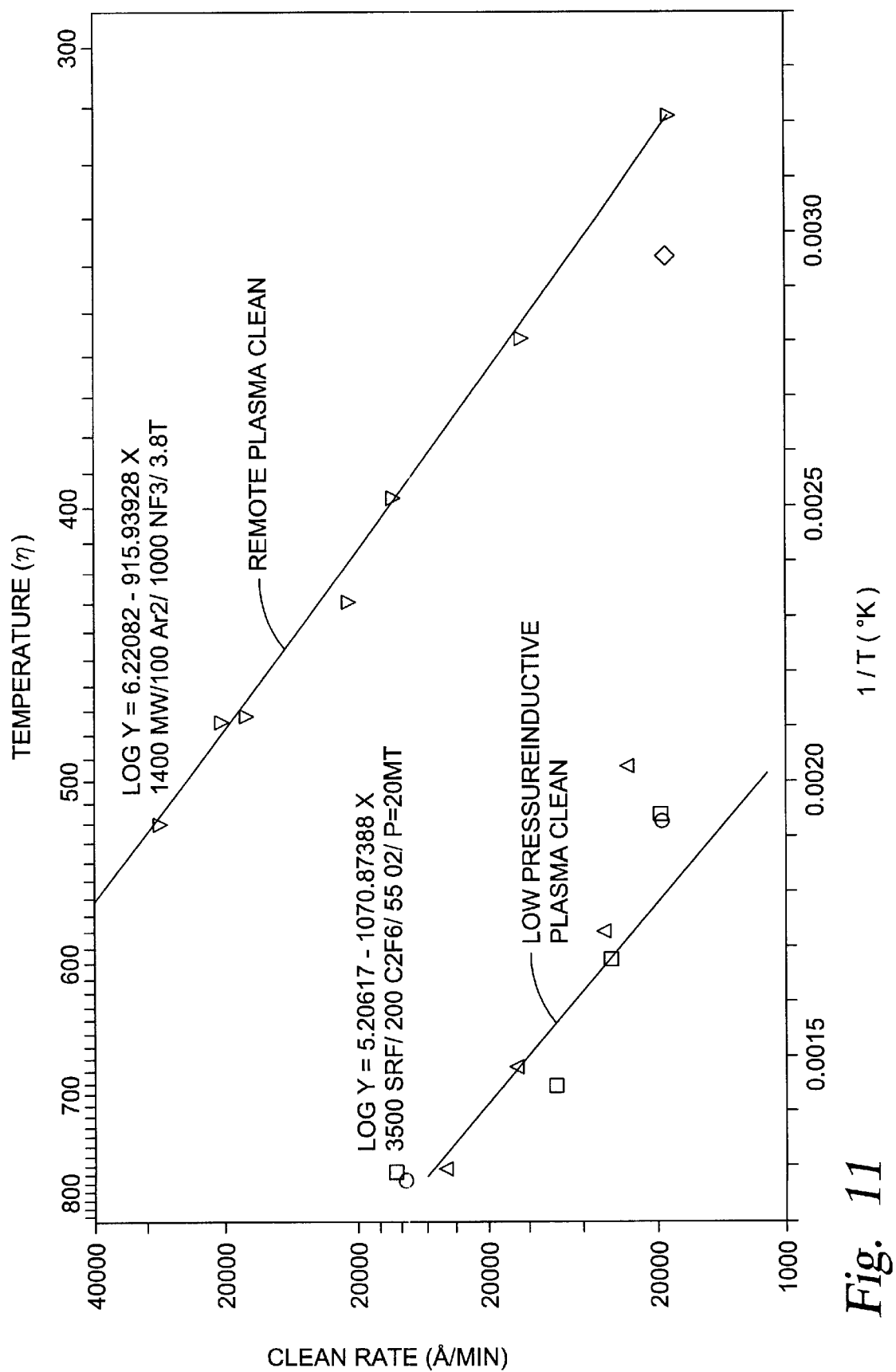
FIG. 11 is a graphical representation showing the temperature dependence of the oxide etch rate using both a low pressure inductive plasma cleaning technique and the remote microwave plasma cleaning technique of the invention.
Figure 12:
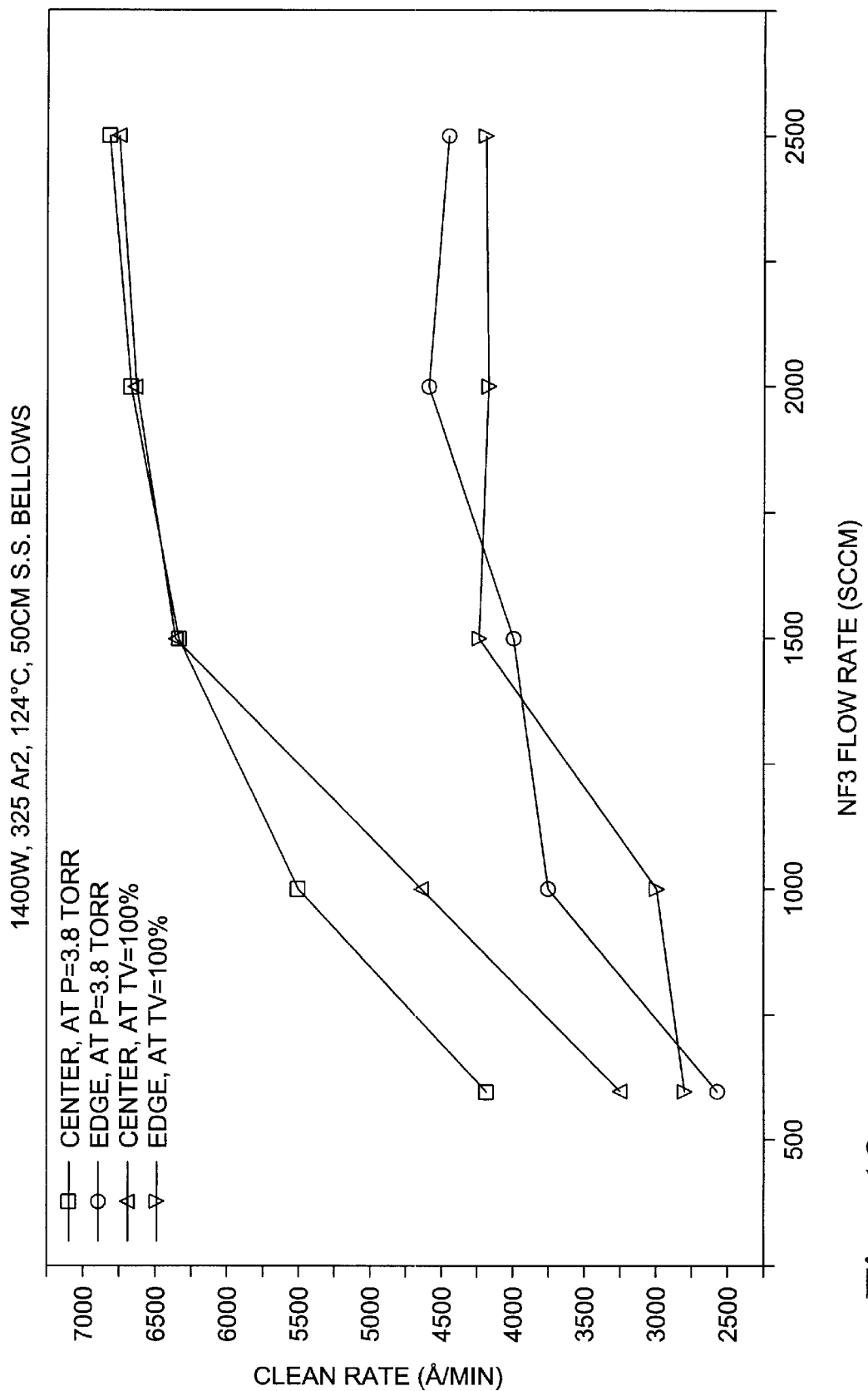
FIG. 12 is a graphical representation showing the $NF_3$ flow rate dependence of the oxide etch rate in the deposition chamber of the present invention.
Figure 13:
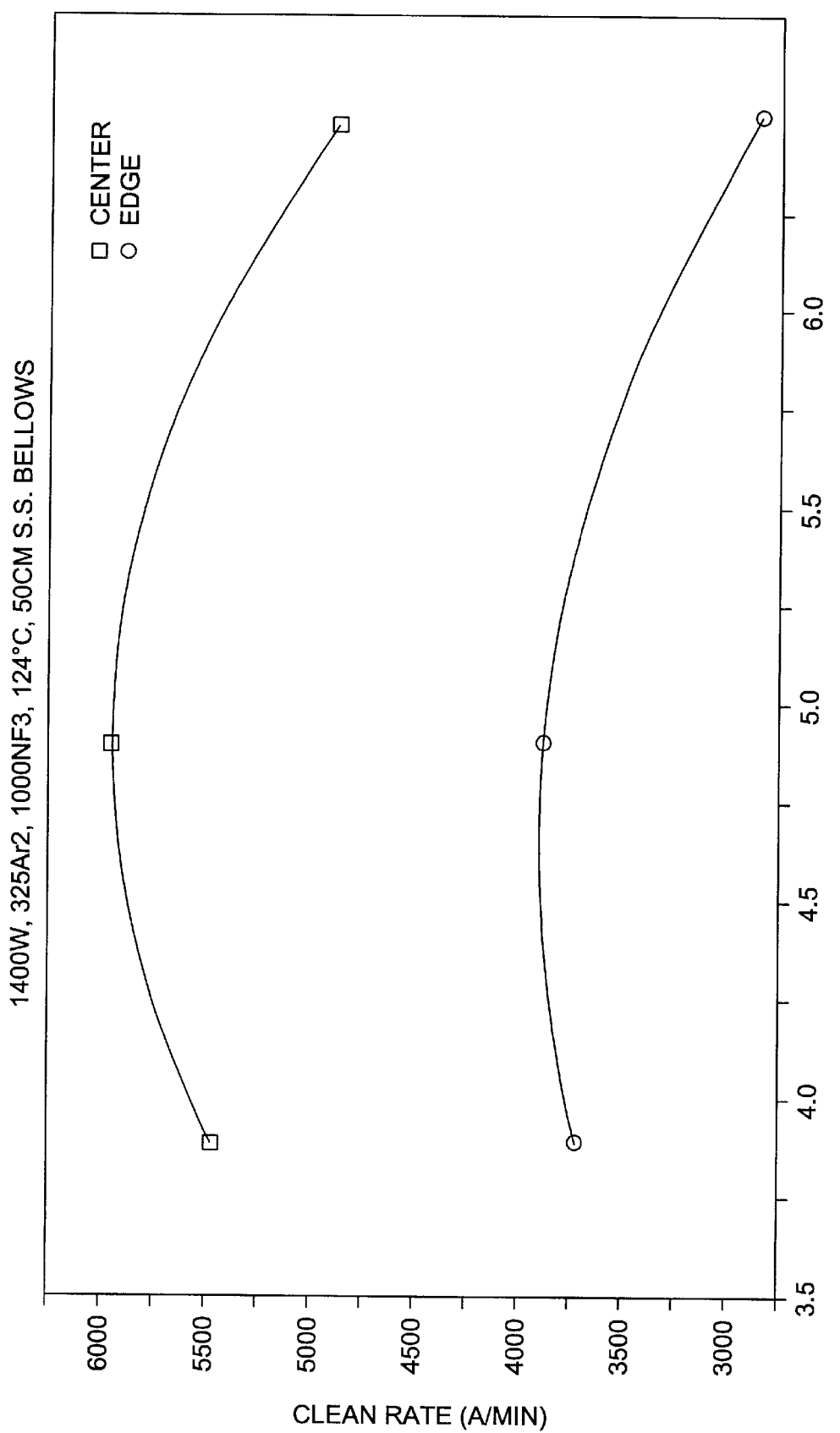
FIG. 13 is a graphical representation showing the chamber pressure dependence at constant temperature using the remote microwave plasma cleaning system of the invention.

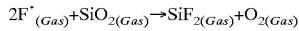
$$2F^*_{(Gas)} + SiO_{2(Gas)} \rightarrow SiF_{2(Gas)} + O_{2(Gas)}$$

producing gaseous products which are removed from chamber 13 by vacuum pumping the gas phase. The reactant gases which are most effective at producing high concentrations of long lived excited neutral Fluorine species $F^*$ are $NF_3$, $F_2$, $SF_6$ and $ClF_3$. However, other cleaning gases which are excitable by microwaves and react with deposition material within the chamber may be used. For the remote microwave cleaning system of FIG. 9 in the present invention, it is preferred to use $NF_3$ and $F_2$ diluted to concentrations of from about 10% to about 50% in inert argon gas. FIGS. 11, 12 and 13 depict graphically the etch rate (reaction rate) as a function of gas flow (FIG. 12), temperature (FIG. 11) and chamber pressure (FIG. 13). Because the desired cleaning reactions produced by the use of the remote microwave excited gas cleaning system of FIG. 9 proceed without any ion bombardment of the chamber or substrate support structures, the need for cover wafers on the electrostatic chuck 20a, or periodic replacement of critical chamber assemblies is avoided. Thus, a much more efficient use and throughput of the system is provided.

While the foregoing is directed to the preferred embodiment of the present invention, other and further embodiments of the invention may be devised without departing from the basic scope thereof, and the scope thereof is determined by the claims which follow.

What is claimed is:

1. An apparatus for processing semiconductor substrates, comprising:

a) an enclosure comprising a sidewall and a lid, the sidewall having a first end and a second end, and the lid connected to the first end of the sidewall;

b) a substrate support member cantilever mounted on the sidewall of the enclosure, the support member having a substrate supporting surface located thereon;

c) a first gas distribution outlet positioned circumferentially about an interior surface of the sidewall between the lid and the substrate supporting surface;

d) a second gas distribution outlet disposed through the lid;

e) an exhaust port connected to the second end of the sidewall;

f) a first RF coil disposed on an exterior surface of the lid; and g) a first frequency-tuning RF power source connected to the first RF coil.

2. The apparatus of claim 1 wherein the frequency-tuning RF power source is adapted to change frequency of the RF power source in response to reflected power.

3. The apparatus of claim 1 wherein the lid comprises a material selected from the group consisting of a ceramic dielectric material, aluminum oxide and aluminum nitride.

4. The apparatus of claim 1, further comprising:

h) a second RF coil disposed on an exterior surface of the lid; and i) a second frequency-tuning RF power source connected to the second RF coil.

5. The apparatus of claim 4, further comprising:

j) a first RF matching network for matching the first RF power supply to the first RF coil and a second RF matching network for matching the second RF power supply to the second RF coil.

6. The apparatus of claim 5 wherein each RF matching network comprises a matching network selected from the group consisting of: a pi impedance matching network, a balanced antenna impedance matching network, and a grounded antenna matching network.

7. The apparatus of claim 4 wherein each frequency tuning RF power source includes a control circuit adapted to adjust a frequency of the RF power source to respond to changes in reflected power.

8. The apparatus of claim 1 wherein the first RF coil comprises a concentrically wound helical coil disposed above the lid.

9. The apparatus of claim wherein the second RF coil comprises an axially wound helical coil disposed around the lid.

10. The apparatus of claim 1 wherein the substrate supporting member comprises an electrostatic chuck having an RF bias power connected thereto.

11. The apparatus of claim 10, wherein the substrate support member includes a dual zone substrate backside gas distribution system disposed on a substrate receiving surface for controlling substrate temperature.

12. The apparatus of claim 10 further comprising:
   h) a substrate RF power supply and a substrate RF matching network coupling RF power to the substrate supporting surface.

13. The apparatus of claim 12 wherein the substrate RF matching network comprises a matching network selected from the group consisting of: a pi impedance matching network, a balanced antenna impedance matching network, and a grounded antenna matching network.

14. The apparatus of claim 1, further comprising:
   h) a cleaning gas feed port disposed on the enclosure connectable to a remote cleaning plasma source; and
   i) one or more cleaning gas inlets defined within the enclosure sidewall connected to the cleaning gas feed port.

15. The apparatus of claim 14 wherein the remote cleaning plasma source comprises a microwave plasma generator.

16. The apparatus of claim 1 wherein the exhaust port tapers from the second end of the sidewall to a flange of an exhaust pumping stack.

17. The apparatus of claim 16 wherein the pumping stack comprises a throttle assembly connected to the exhaust port, a valve connected to the throttle assembly and a vacuum pump connected to the valve.

18. The apparatus of claim 17 wherein the exhaust port and the pumping stack are disposed substantially axially below the substrate support member.

19. The apparatus of claim 1, further comprising:
   h) a heater plate and a cold plate disposed on the chamber lid.

20. A method for processing a substrate, comprising:
   a) positioning the substrate on a substrate support member that is cantilever mounted on a sidewall of a processing chamber;
   b) introducing a first gas through a first gas distribution system positioned circumferentially about an interior surface of the sidewall between a chamber lid and the substrate support member;
   c) introducing a second gas through a second gas distribution system disposed through the lid;
   d) generating a plasma of the first and second gases introduced into the chamber using a first frequency-tuning RF power source connected to a first RF coil disposed on an exterior surface of the lid and a second frequency-tuning RF power source connected to a second coil disposed on an exterior surface of the lid, whereby a process selected from the group comprising deposition and etching is performed on the substrate; and
   e) exhausting the gases through an exhaust port connected on an end opposite of the lid.

21. The method of claim 20, further comprising:
   f) controlling a temperature of the substrate disposed on the substrate support member using a dual zone substrate backside gas distribution system disposed on a substrate receiving surface.

22. The method of claim 21, further comprising:
   f) removing the substrate from the chamber; and
   g) cleaning the chamber using a plasma supplied from a remote plasma source.

23. The method of claim 22 wherein the remote plasma source supplies excited fluorine atoms from a cleaning gas selected from the group consisting of $NF_3$, $F_2$, $SF_6$, and $ClF_3$.

24. The method of claim 23 wherein the excited fluorine atoms in the cleaning gas are diluted with argon gas to a concentration between about 10% and about 50%.

25. The method of claim 20, further comprising:
   f) varying a frequency of the RF power sources to respond to changes in reflected power.

26. The method of claim 20, further comprising:
   f) controlling a temperature of the chamber lid.

* * * * *

UNITED STATES PATENT AND TRADEMARK OFFICE
CERTIFICATE OF CORRECTION

PATENT NO. : 6,170,428 B1
DATED : January 9, 2001
INVENTOR(S) : Receker et al.

It is certified that error appears in the above-identified patent and that said Letters Patent is hereby corrected as shown below:

Column 5,
Line 38, please replace "35a" with "235a".
Line 39, please replace "35b" with "235b".

Signed and Sealed this

Twenty-fifth Day of September, 2001

Attest:

*Attesting Officer*

NICHOLAS P. GODICI
*Acting Director of the United States Patent and Trademark Office*